(12) United States Patent
Shindo

(10) Patent No.: US 7,476,968 B2
(45) Date of Patent: Jan. 13, 2009

(54) SEMICONDUCTOR DEVICE INCLUDING AN UNDER ELECTRODE AND A BUMP ELECTRODE

(75) Inventor: Akinori Shindo, Kobuchizawa-cho (JP)

(73) Assignee: Seiko Epson Corporation, Tokyo (JP)

( * ) Notice: Subject to any disclaimer, the term of this patent is extended or adjusted under 35 U.S.C. 154(b) by 232 days.

(21) Appl. No.: 11/453,063

(22) Filed: Jun. 15, 2006

(65) Prior Publication Data

US 2006/0237842 A1    Oct. 26, 2006

Related U.S. Application Data

(63) Continuation of application No. 10/958,274, filed on Oct. 6, 2004, now abandoned.

(30) Foreign Application Priority Data

Oct. 9, 2003   (JP) ............................. 2003-350953

(51) Int. Cl.
   *H01L 23/48*   (2006.01)
(52) U.S. Cl. ...................... 257/737; 257/781
(58) Field of Classification Search ................ 257/734, 257/737, 738, 778, 780, 781
   See application file for complete search history.

(56) References Cited

U.S. PATENT DOCUMENTS

| 5,736,456 A | * | 4/1998 | Akram | ........................ 438/614 |
|---|---|---|---|---|
| 5,821,626 A | | 10/1998 | Ouchi et al. | |
| 2002/0041013 A1 | | 4/2002 | Wakamiya et al. | |
| 2003/0025203 A1 | * | 2/2003 | Akram et al. | ................ 257/737 |

FOREIGN PATENT DOCUMENTS

| JP | A-1-146342 | | 6/1989 |
|---|---|---|---|
| JP | 05021523 A | * | 1/1993 |
| JP | A-5-55228 | | 3/1993 |
| JP | A-6-151436 | | 5/1994 |
| JP | A-11-186309 | | 7/1999 |
| JP | A-2001-028379 | | 1/2001 |
| JP | A-2002-118199 | | 4/2002 |

* cited by examiner

Primary Examiner—Thomas L Dickey
(74) Attorney, Agent, or Firm—Oliff & Berridge, PLC

(57) ABSTRACT

Making the relative size of the surface area of a bump electrode at a portion in contact with an under electrode larger than the surface area of a base of a hole increases the contact surface area between the lower surface of the bump electrode and a polyimide layer. As a result, effect by the polyimide layer to mitigate the impact loads applied during bonding greatly increases. The impact loads applied during bonding can also be mitigated by using a material for the conductive layer that is as flexible as, or even more flexible than, the material of the bump electrode. It is therefore possible to reduce cracks in semiconductor chips or the like directly under the bump electrode more efficiently.

5 Claims, 12 Drawing Sheets

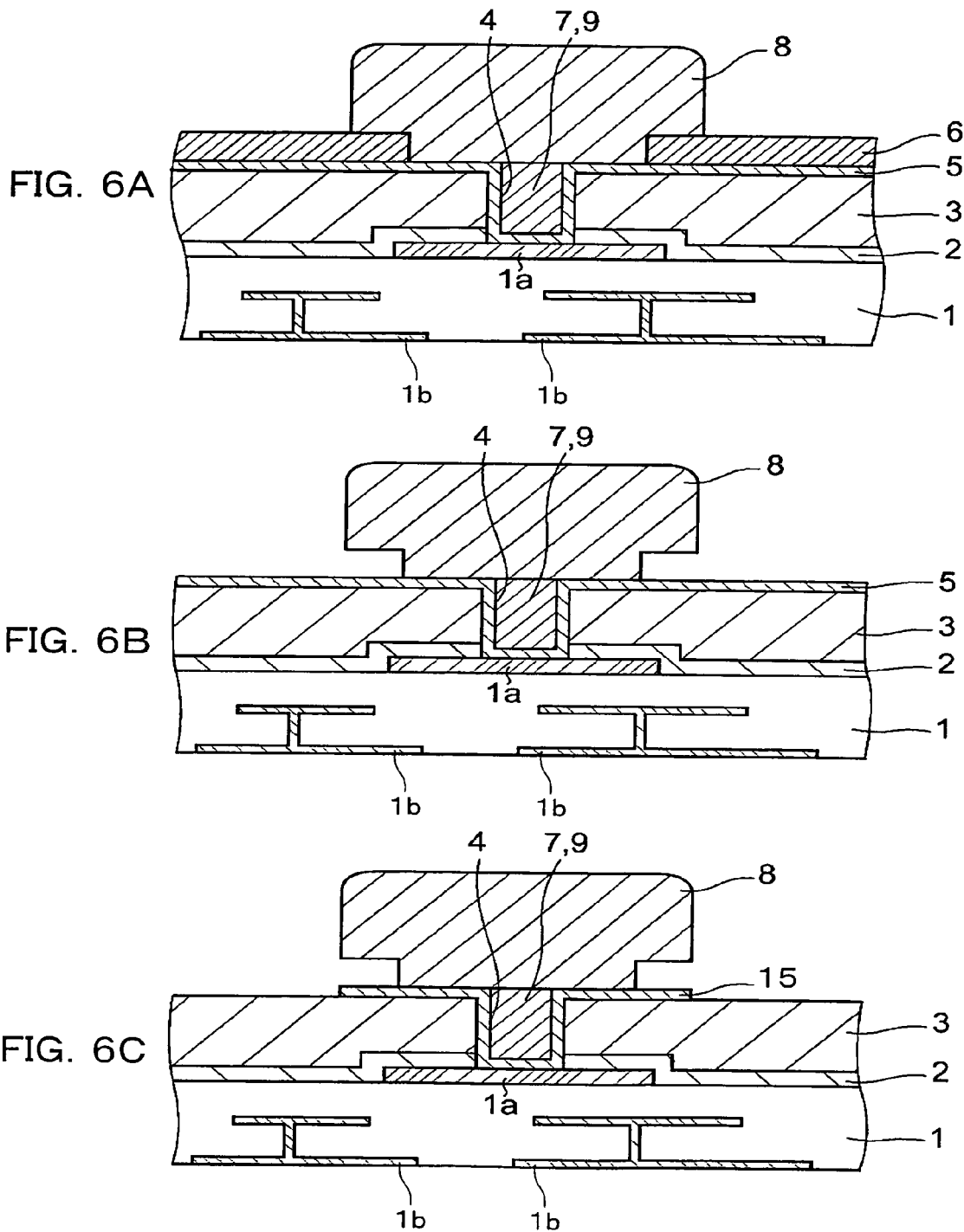

SEMICONDUCTOR DEVICE INCLUDING AN UNDER ELECTRODE AND A BUMP ELECTRODE

This is a Division of application Ser. No. 10/958,274 filed Oct. 6, 2004. The disclosure of the prior application is hereby incorporated by reference herein in its entirety Japanese Patent Application No. 2003-350953, filed on Oct. 9, 2003, is hereby incorporated by reference in its entirety.

BACKGROUND OF THE INVENTION

The present invention relates to a semiconductor device having a bump electrode and a method of manufacturing the same.

Bump electrodes are generally formed in the art at positions around the chip periphery at which semiconductor chips are not formed. The chip is bonded by means such as thermal pressure by tape automated bonding (TAB) techniques, by way of example. With TAB, there is a possibility of a crack of the chip in the vicinity of the underneath of the bump electrodes, due to stresses imparted to the chip through the bump electrodes during the thermal pressure. The general procedure is therefore to form the bump electrodes 8 for bonding so that they are disposed around the periphery of the chip, and not form and bump electrodes in a region 10 in which the semiconductor chips are formed (the active surface), as shown by way of example in FIG. 10. If bump electrodes are formed around the periphery of the chip, however, the surface area increases and a technical problem arises in that it is not possible to make the chip smaller.

To prevent a crack of such a chip in this case, techniques are known of providing the semiconductor device with a buffer material for mitigating thermal stresses and impact stresses due to the heating and impact applied during the bonding (Japanese Patent Laid-Open No. 5-55228 and Japanese Patent Laid-Open No. 6-151436). The configuration of the bump electrode of Japanese Patent Laid-Open No. 5-55228 is shown in FIG. 12.

First there is a silicon substrate 21 on which is formed aluminum wiring (an electrode) 22. A silicon nitride film (insulating protective layer) 23 is formed thereabove, to protect the electrode. An aperture portion 26 is formed in the silicon nitride film 23, extending as far as the aluminum wiring 22. A polyimide film 25 is formed over the silicon nitride film 23 as a buffer layer. An aperture portion 27 is formed in the polyimide film 25, extending as far as the aluminum wiring 22. The aperture portion 27 formed in the polyimide film 25 is formed on the inner side of the aperture portion 26 in the silicon nitride film 23. The side surface of the aperture portion 26 is therefore covered by the polyimide film 25. A titanium film 24 is formed over the polyimide film 25, the side surface of the aperture portion 27, and the aluminum wiring 22 as an under electrode. A copper film 30 is formed over the titanium film 24. A copper plated film 28 is formed over the copper film 30. A gold plated film 29 is formed over the copper plated film 28.

A bump electrode 31 that is formed of this gold plated film 29 and the copper plated film 28 is subjected to bonding loads due to forces such as thermal pressure during the bonding, but the polyimide film 25 can act as a buffer layer to mitigate stresses applied during the bonding to the lower surface of the bump electrode 31 that is in contact therewith through the titanium film 24. As a result, it is possible to prevent a crack of the silicon nitride film 23 that acts as the insulating protective film, enabling a reduction in damage to the chip.

Japanese Patent Laid-Open No. 6-151436 has a bump electrode of a mushroom shape that is similar to that of Japanese Patent Laid-Open No. 5-55228, where a polyimide is formed as a buffer film in a cavity portion of this umbrella shape. The effect of this configuration of the bump electrode also makes it possible to prevent a crack of the protective insulating film of the electrode, in a similar manner to Japanese Patent Laid-Open No. 5-55228.

However, there is a danger in the configurations of both Japanese Patent Laid-Open No. 5-55228 and Japanese Patent Laid-Open No. 6-151436 that the fat "neck" portion of the mushroom shape could cause a crack of the elements, even though the buffer film mitigates impact loads due to factors such as thermal pressure during bonding. If the material of the neck portion of the bump electrode has a hardness on the order of copper, the impact loads applied during bonding are even more likely to be transferred directly to the elements.

In addition, the manufacturing method of Japanese Patent Laid-Open No. 5-55228 necessitates an extra step of forming a photoresist film when forming the aperture portion 26 or the aperture portion 27 in the polyimide film 25 that acts as a buffer film of the silicon nitride film 23 that protects the electrode.

BRIEF SUMMARY OF THE INVENTION

A first aspect of the present invention relates to a semiconductor device including:
a semiconductor substrate having an electrode;
a protective insulating layer which protects the electrode;
a buffer layer formed over the protective insulating layer;
a hole provided over the electrode in such a manner as to penetrate the protective insulating layer and the buffer layer;
an under electrode formed over a surface of the buffer layer, an inner surface of the hole, and a surface of the electrode;
a conductive layer of an electrically conductive material which is formed in the hole; and
a bump electrode formed on the under electrode and on the conductive layer,
wherein the electrically conductive material is a material that is more flexible than a material of the bump electrode.

A second aspect of the present invention relates to a semiconductor device including:
a semiconductor substrate having an electrode;
a protective insulating layer which protects the electrode;
a buffer layer formed over the protective insulating layer;
a hole provided over the electrode in such a manner as to penetrate the protective insulating layer and the buffer layer;
an under electrode formed over a surface of the buffer layer, an inner surface of the hole, and a surface of the electrode;
a conductive layer of an electrically conductive material which is formed in the hole; and
a bump electrode formed on the under electrode and on the conductive layer,
wherein the ratio of a surface area of the bump electrode at a portion in contact with the under electrode and the conductive layer to a surface area of a base of the hole is greater than or equal to 5 and less than or equal to 100.

A third aspect of the present invention relates to a semiconductor device including:
a semiconductor substrate having an electrode;
a protective insulating layer which protects the electrode;
a buffer layer formed over the protective insulating layer;
a hole provided over the electrode in such a manner as to penetrate the protective insulating layer and the buffer layer;

an under electrode formed over a surface of the buffer layer, an inner surface of the hole, and a surface of the electrode;

a conductive layer of an electrically conductive material which is formed in the hole; and a bump electrode formed on the under electrode and on the conductive layer, wherein the ratio of the thickness of the buffer layer with respect to the diameter of the hole is greater than or equal to 1 but less than or equal to 3.

A fourth aspect of the present invention relates to a method of manufacturing a semiconductor device including:

forming a protective insulating layer for protecting an electrode, on a semiconductor substrate having the electrode;

forming a buffer layer over the protective insulating layer;

forming a hole in the protective insulating layer and the buffer layer over the electrode;

forming an under electrode layer over the surface of the buffer layer, the inner surface of the hole, and the electrode;

forming a pattern mask which defines a region for forming a bump electrode on the under electrode layer;

continuously forming a bump electrode and a conductive layer by a plating method in a region for forming the bump electrode and in the inner surface of the hole, respectively; and removing a part of the under electrode layer, to form an under electrode.

A fifth aspect of the present invention relates to a method of manufacturing a semiconductor device including:

forming a protective insulating layer for protecting an electrode, on a semiconductor substrate having the electrode;

forming a photosensitive polyimide layer as a buffer layer over the protective insulating layer;

forming a hole in the photosensitive polyimide layer by photolithography;

using the photosensitive polyimide layer as a mask to remove the protective insulating layer to form a hole;

forming an under electrode layer over the surface of the buffer layer, the inner surface of the hole, and the electrode;

forming a pattern mask which defines a region for forming a bump electrode on the under electrode layer;

continuously forming a bump electrode and a conductive layer by a plating method in a region for forming the bump electrode and in the inner surface of the hole, respectively; and removing a part of the under electrode layer, to form an under electrode.

A sixth aspect of the present invention relates to a method of manufacturing a semiconductor device including:

forming a protective insulating layer for protecting an electrode, on a semiconductor substrate having the electrode;

forming a buffer layer over the protective insulating layer;

forming a hole in the protective insulating layer and the buffer layer over the electrode;

forming an under electrode layer over the surface of the buffer layer, the inner surface of the hole, and the electrode;

forming a conductive layer in the hole by an electrically conductive material that is more flexible than a material of a bump electrode after the formation of the under electrode layer, forming a pattern mask which defines a region for forming a bump electrode on the under electrode layer;

forming a bump electrode over the under electrode layer and the conductive layer; and removing a part of the under electrode layer, to form an under electrode.

BRIEF DESCRIPTION OF THE SEVERAL VIEWS OF THE DRAWING

FIGS. 6A to 6C are schematic sections illustrating steps in the manufacture of a semiconductor device in accordance with the second embodiment;

DETAILED DESCRIPTION OF THE EMBODIMENT

Figure 1A:
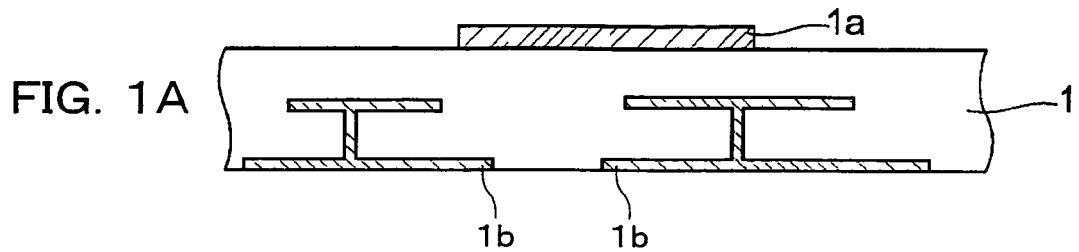
FIGS. 1A to 1D are schematic sections illustrating steps in the manufacture of a semiconductor device in accordance with a first embodiment of the present invention.

An embodiment of the present invention may provide a semiconductor device and a method of manufacturing the same that make it possible to efficiently suppress any crack of semiconductor chips that exist under the active surface during bonding by pressure, such as thermal pressure, even when bump electrodes are disposed on the active surface of the chip.

A semiconductor device according to an embodiment of the present invention includes:

a semiconductor substrate having an electrode;

a protective insulating layer which protects the electrode;

a buffer layer formed over the protective insulating layer;

a hole provided over the electrode in such a manner as to penetrate the protective insulating layer and the buffer layer;

an under electrode formed over a surface of the buffer layer, an inner surface of the hole, and a surface of the electrode;

a conductive layer of an electrically conductive material which is formed in the hole; and a bump electrode formed on the under electrode and on the conductive layer, wherein the electrically conductive material is a material that is more flexible than a material of the bump electrode.

By forming the conductive layer between the bump electrode and the electrode of the semiconductor substrate of a material that is more flexible than that of the bump electrode, this configuration makes it possible to mitigate impact loads applied during bonding by a synergistic effect between that flexible conductive layer and the buffer layer formed over the protective insulating layer. It is therefore possible to efficiently suppress a crack of any semiconductor chips or the like, even if they arc formed directly under the bump electrode.

A semiconductor device according to an embodiment of the present invention includes:

a semiconductor substrate having an electrode;

a protective insulating layer which protects the electrode;

a buffer layer formed over the protective insulating layer;

a hole provided over the electrode in such a manner as to penetrate the protective insulating layer and the buffer layer;

an under electrode formed over a surface of the buffer layer, an inner surface of the hole, and a surface of the electrode;

a conductive layer of an electrically conductive material which is formed in the hole; and a bump electrode formed on the under electrode and on the conductive layer, wherein the ratio of a surface area of the bump electrode at a portion in contact with the under electrode and the conductive layer to a surface area of a base of the hole is greater than or equal to 5 and less than or equal to 100.

By making the surface area of the bump electrode at a portion in contact with the under electrode larger than the surface area of the base of the hole, the effect of mitigating impact loads applied during bonding increases since the surface area of the contact between the lower surface of the bump electrode and the buffer layer has been increased. It is therefore possible to suppress a crack of any semiconductor chips or the like, even if they are formed directly under the bump electrode. If the bump electrode is formed by a method such as plating, a depression may be formed in correspondence to the dimensions of the hole positioned over the hole in the bump electrode surface, but such a depression would account for only a small proportion of the bump electrode surface. Thus the flatness of the bump electrode surface is improved and the surface area of bonding during the thermal pressure bonding is increased, increasing the bonding strength. The pressures applied during thermal pressure can be relatively reduced by the increase in the boding surface area due to the flatness of the bump electrode, which also helps reduce the impact applied to the chip.

A semiconductor device according to an embodiment of the present invention includes:

a semiconductor substrate having an electrode;

a protective insulating layer which protects the electrode;

a buffer layer formed over the protective insulating layer, a hole provided over the electrode in such a manner as to penetrate the protective insulating layer and the buffer layer;

an under electrode formed over a surface of the buffer layer, an inner surface of the hole, and a surface of the electrode;

a conductive layer of an electrically conductive material which is formed in the hole; and a bump electrode formed on the under electrode and on the conductive layer, wherein the ratio of the thickness of the buffer layer with respect to the diameter of the hole is greater than or equal to 1 but less than or equal to 3.

If the ratio of the thickness of the buffer layer to the diameter of the hole is greater than or equal to 1, in other words, if the thickness of the buffer layer is greater than the length of the base surface of the hole, this configuration would make it possible for the buffer layer to sufficiently mitigate the impact loads applied during bonding. In addition, increasing the ratio of the thickness of the buffer layer to the diameter of the hole enables a relative thinning of the conductive layer. If the electrically conductive material of the conductive layer is a metal, by way of example, the expansion thereof can be increased by making the shape thinner. As a result, not only can it withstand impact stresses, it also increases the effect of absorbing other stresses. If the ratio of the thickness of the buffer layer to the diameter of the hole is less than or equal to 3, and the under electrode on the inner surface of the hole is formed by a method such as sputtering, this would have the effect of stabilizing the step of forming that under electrode.

With any of the above semiconductor devices, the hole and the conductive layer may be formed at substantially a center of the bump electrode.

This configuration nearly prevent the conductive layer from being non-uniformly applied bonding loads of the bump electrode due to factors such as thermal pressure during bonding, so that loads are transferred in a substantially axial direction. The resistance with respect to bonding load can therefore be increased, making it possible to perform stable bonding.

With any of the above semiconductor devices, the buffer layer may be of a photosensitive polyimide.

Since this configuration makes it possible to use the buffer layer formed of photosensitive polyimide as a photo-mask in the step for forming the conductive layer, thus enabling a reduction in the photolithography steps. This therefore has the advantage of reducing manufacturing costs.

With any of the above semiconductor devices, the electrically conductive material formed in the conductive layer may be formed of the same material as a material of the bump electrode.

Since the conductive layer and the bump electrode can be formed continuously, this configuration makes it possible to shorten the manufacturing process.

With any of the above semiconductor devices, the electrically conductive material may be a material that is more flexible than a material of the bump electrode.

This configuration makes it possible to efficiently absorb stresses during bonding, by making the electrically conductive material of the conductive layer more flexible than the material of the bump electrode.

With any of the above semiconductor devices, the bump electrode may be formed of gold or a gold alloy.

Since gold or a gold alloy is a material with superior flexibility, this configuration makes it possible to efficiently absorb stresses during bonding when the conductive layer has been made of the same electrically conductive material as the bump electrode. In addition, since this is a chemically stable substance, it has the advantage of superlative environment-proofing.

A method of manufacturing a semiconductor device according to an embodiment of the present invention includes:

forming a protective insulating layer for protecting an electrode, on a semiconductor substrate having the electrode;

forming a buffer layer over the protective insulating layer;

forming a hole in the protective insulating layer and the buffer layer over the electrode;

forming an under electrode layer over the surface of the buffer layer, the inner surface of the hole, and the electrode;

forming a pattern mask which defines a region for forming a bump electrode on the under electrode layer;

continuously forming a bump electrode and a conductive layer by a plating method in a region for forming the bump electrode and in the inner surface of the hole, respectively; and removing a part of the under electrode layer, to form an under electrode.

Since the conductive layer and the bump electrode are formed continuously of the same material, the manufacturing process can be simplified. It is therefore possible to reduce the manufacturing costs.

A method of manufacturing a semiconductor device according to an embodiment of the present invention includes:

forming a protective insulating layer for protecting an electrode, on a semiconductor substrate having the electrode;

forming a photosensitive polyimide layer as a buffer layer over the protective insulating layer;

forming a hole in the photosensitive polyimide layer by photolithography;

using the photosensitive polyimide layer as a mask to remove the protective insulating layer to form a hole;

forming an under electrode layer over the surface of the buffer layer, the inner surface of the hole, and the electrode;

forming a pattern mask which defines a region for forming a bump electrode on the under electrode layer;

continuously forming a bump electrode and a conductive layer by a plating method in a region for forming the bump electrode and in the inner surface of the hole, respectively; and removing a part of the under electrode layer, to form an under electrode.

By forming the buffer layer of a photosensitive polyimide, this method makes it possible to open up the buffer layer by exposure and development in a photolithography step performed on the photosensitive polyimide. This photosensitive polyimide can also be used as a mask in a step of opening the protective insulating layer by a method such as etching. Since the conductive layer and the bump electrode are formed continuously of the same material, the manufacturing process can be further simplified.

A method of manufacturing a semiconductor device according to an embodiment of the present invention includes:

forming a protective insulating layer for protecting an electrode, on a semiconductor substrate having the electrode;

forming a buffer layer over the protective insulating layer;

forming a hole in the protective insulating layer and the buffer layer over the electrode;

forming an under electrode layer over the surface of the buffer layer, the inner surface of the hole, and the electrode;

forming a conductive layer in the hole by an electrically conductive material that is more flexible than a material of a bump electrode after the formation of the under electrode layer;

forming a pattern mask which defines a region for forming a bump electrode on the under electrode layer;

forming a bump electrode over the under electrode layer and the conductive layer; and removing a part of the under electrode layer, to form an under electrode.

This method makes it possible to efficiently absorb stresses during bonding, by making the electrically conductive material more flexible than the material of the bump electrode.

An essential point of embodiments of the present invention is that the electrically conductive material is an electrically conductive resin.

Since the electrically conductive material is an electrically conductive resin, this method has the effect of further increasing the stress mitigation by the electrically conductive material, in comparison with the use of a metal, by way of example.

In an embodiment of the present invention, the buffer layer is formed of a photosensitive polyimide, and a hole is formed in the photosensitive polyimide by photolithography and also the photosensitive polyimide in which that hole is formed is used as a pattern mask to form the hole in the protective insulating layer, during the step of forming the hole.

By forming the buffer layer of a photosensitive polyimide, this method makes it possible to open up the buffer layer by exposure and development in a photolithography step performed on the photosensitive polyimide. Since that photosensitive polyimide can be used as a mask for the opening of the protective insulating film and also the step of etching, it enables a simplification of the manufacturing process.

First Embodiment

A first embodiment of the present invention is described below with reference to FIGS. 1 to 4, 8, and 9.

A section through a semiconductor substrate on which is formed an electrode is shown in FIG. 1A. Semiconductor chips such as transistors (not shown in the figure) and electrical wiring 1b that is connected to those semiconductor chips is formed within a semiconductor substrate 1. An electrode 1a is formed on the surface of the semiconductor substrate 1. The shape of the electrode 1a is square, with the length of one side being 50 to 100 μm. The electrode 1a is made of aluminum.

Figure 1B:
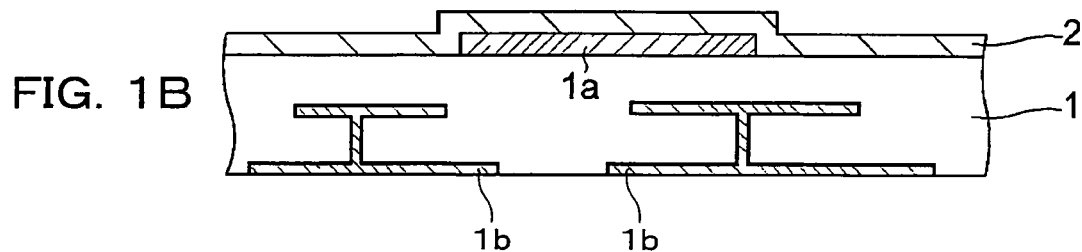

A sectional view illustrating a step of forming a protective insulating layer on the semiconductor substrate 1 for protecting the electrode 1a is shown in FIG. 1B. Silicon nitride is used in a protective insulating layer 2. The protective insulating layer (silicon nitride layer) 2 is formed by chemical vapor deposition (CVD) to a thickness of approximately 100 nm. Note that the silicon nitride layer 2 that acts as a protective insulating layer plays the role of preventing deterioration of the electrode 1a due to factors such a oxidation caused by moisture. In this case, the silicon nitride layer 2 is used in the protective insulating layer of this embodiment, but it could be any material that has insulating and moisture-proofing capabilities. More specifically, silicon oxide, silicon oxide nitride, or an organic material such as a resin could be used therefor.

Figure 1C:
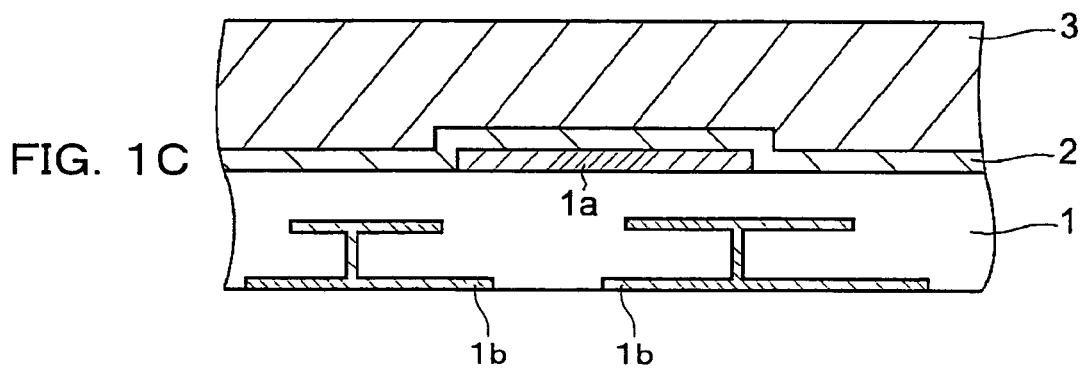

A sectional view illustrating a step of forming a buffer layer is shown in FIG. 1C. In this embodiment, a photosensitive polyimide is used as a polyimide layer 3. The formation of the buffer layer (photosensitive polyimide layer) 3 is done by a spin-coating method. After the spin-coating, pre-baking is done to drive off part of the solvent component of the polyimide layer 3, thus stabilizing the polyimide layer 3. The pre-baking is done under predetermined conditions at 50° C. or less. The thickness of the polyimide layer 3 this time is approximately 15 μm.

Figure 1D:
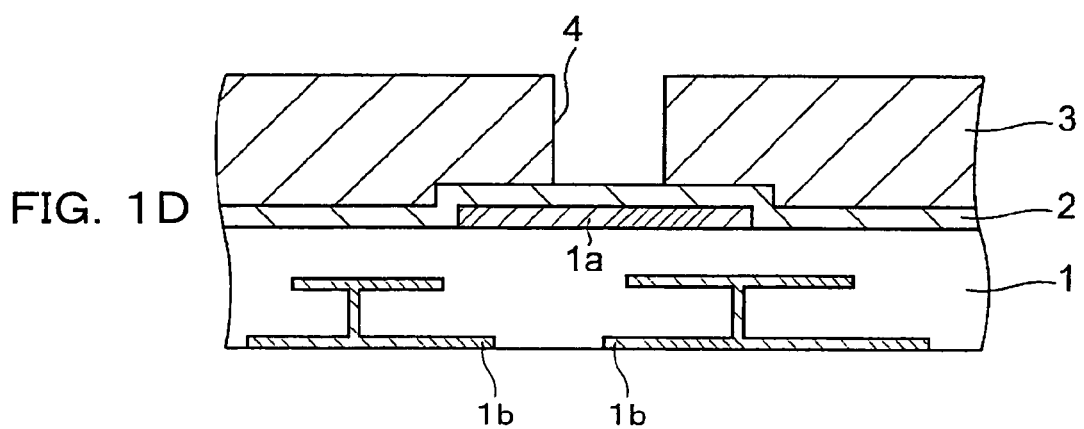

A sectional view illustrating a step of forming a hole 4 in the polyimide layer 3 that acts as a buffer layer is shown in FIG. 1D. The hole 4 is formed by photolithography. At the end of the pre-baking, the polyimide layer 3 is exposed then developed to form a pattern in accordance with a predetermined mask. The substrate is then subjected to post-baking to stabilize the polyimide layer 3. At this point, the final thickness of the polyimide layer 3 is approximately 10 μm and the inner diameter of the hole 4 is approximately 5 μm. The hole 4 is also formed to be at substantially the center of the electrode 1a.

Figure 2A:
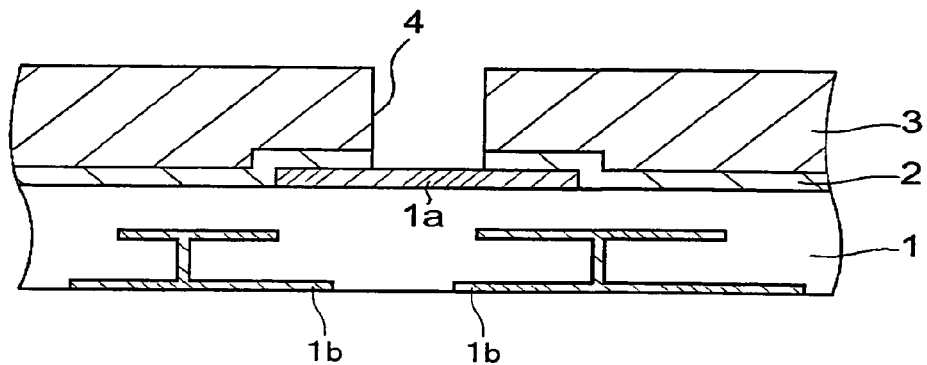
FIGS. 2A to 2C are schematic sections illustrating steps in the manufacture of a semiconductor device in accordance with the first embodiment.

A sectional view illustrating a step of forming a hole with respect to the silicon nitride layer 2 is shown in FIG. 2A. The opening of the silicon nitride layer 2 is done by a dry etching method. During this time, the silicon nitride layer 2 is opened by using the polyimide layer 3 as a mask for the dry etching. Note that since the polyimide layer 3 will also be partially damaged by the dry etching, reducing the thickness thereof, that thickness should be set originally from consideration of that reduction.

The description now turns to a process in which the photosensitive polyimide is not used in this case, by way of comparison. The polyimide layer 3 is first formed by a method such as spin-coating. After the polyimide layer 3 has been stabilized by post-baking, the photoresist (not shown in the figure) is formed by spin-coating over the polyimide layer 3. A predetermined pattern is then formed in the photoresist by photolithography. The polyimide layer 3 is then etched by dry etching method form the hole 4. The hole 4 is then formed in the silicon nitride layer 2 by dry etching. After the hole 4 has been formed, the photoresist is removed by an ashing method.

In other words, if no photosensitive polyimide is used, a superfluous photoresist formation step and a corresponding photoresist removal step have to be inserted. In addition, since the photoresist is a polyimide or resin material and either of these materials is porous in comparison with an inorganic material, a situation occurs in that the materials of the photoresist and the polyimide layer 3 become combined in the vicinity of the interface therebetween. After the polyimide layer 3 has been removed by dry etching, the photoresist could be damaged by the plasma. It is therefore more difficult to remove the photoresist. Furthermore, with ashing used as the method of removing the resist, it is difficult to confirm the end of the removal of the resist. In addition, scum generally occurs during the removal of an organic film by ashing. Since it is difficult to remove scum of a mixture of a polyimide and photoresist, it is necessary to provide measures such as a reinforcement of the cleaning step. It is therefore better to use a photosensitive polyimide in the formation of the polyimide layer 3 as in this embodiment. Note that the ratio of the thickness of the hole 4 to the diameter of the hole 4 (the thickness of the hole 4 to the diameter of the hole 4; hereinafter called the "aspect ratio") is controlled to be between 1 and 2.

Figure 2B:
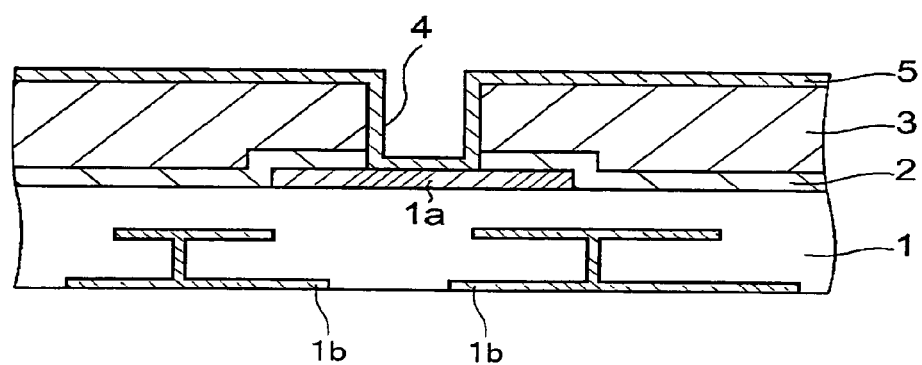

A sectional view illustrating a step of forming an under electrode layer 5 is shown in FIG. 2B. The under electrode layer 5 is formed by a sputtering method. The under electrode layer 5 is formed on the polyimide layer 3 and the inner surface of the hole 4. The under electrode layer 5 has the roles of acting as an electrode for the formation of the bump electrode 8 by a method such as plating and acting to prevent any formation of an alloy between the electrode 1a formed on aluminum on the semiconductor substrate 1 and the bump electrode 8. Alloying of the under electrode layer 5 and the bump electrode 8 increases the possibility of problems such as an increase in electrical resistance and the danger of brittleness in the effective strength of the electrode. This embodiment uses Ti—W as the material of the under electrode layer 5. Note the uppermost surface of the under electrode layer 5 could be formed of a metal that can be used in the bump electrode 8.

Figure 2C:
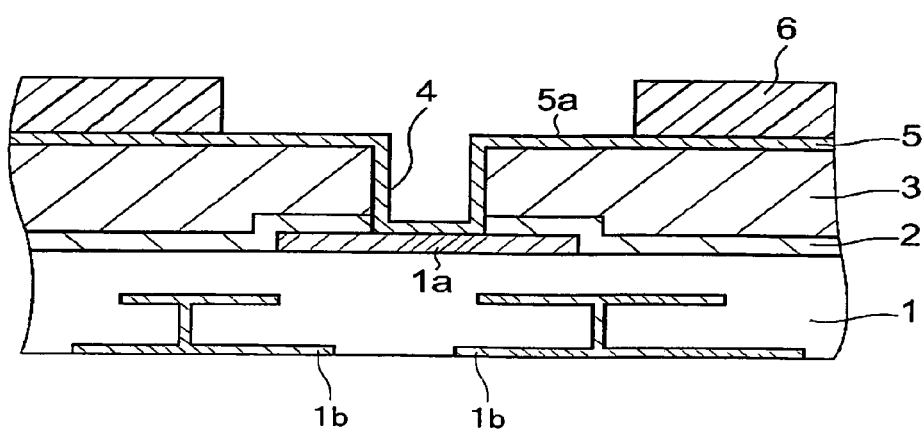

A sectional view illustrating a step of forming photoresist 6 for forming the bump electrode 8 is shown in FIG. 2C. The photoresist 6 is first formed over the entire surface of the semiconductor substrate 1 by a spin-coating method. The photoresist 6 is then exposed and developed, to remove the photoresist 6 in a region including the hole 4. The portion from which the photoresist 6 has been removed becomes a bump electrode formation region 5a. The surface area for the region for forming the bump electrode 8 is approximately 1600 μm$^2$, including the surface area of the hole 4.

Figure 3A:
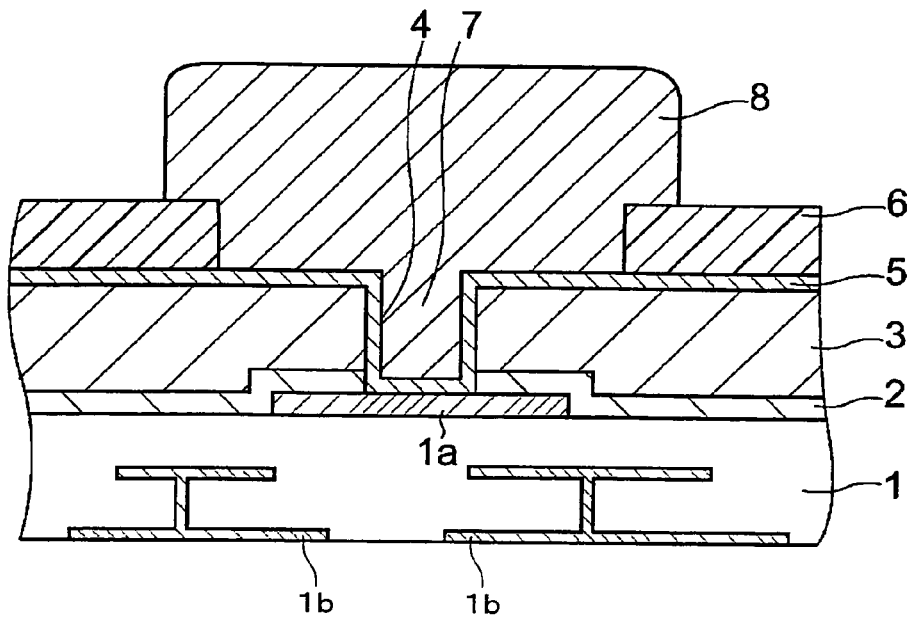
FIGS. 3A and 3B are schematic sections illustrating steps in the manufacture of a semiconductor device in accordance with the first embodiment.

A sectional view illustrating a step of forming the bump electrode is shown in FIG. 3A. The material of the bump electrode 8 is gold. The bump electrode 8 is formed by an electroplating method. Note that in this embodiment, a conductive layer 7 is formed by the electroplating method at the same time as the bump electrode 8. The electrically conductive material of the conductive layer 7 is therefore gold. In this case, the thickness of the bump electrode 8 in accordance with this embodiment is on the order of 15 to 30 μm. The surface area of the bump electrode 8 is approximately 2500 μm$^2$.

The surface area of the bump electrode 8 is determined by the thickness of the photoresist 6 and the thickness of the bump electrode 8. Gold is first overlaid over the unmodified pattern shape of the photoresist 6 until it reaches the thickness of the photoresist 6. Once the thickness of the photoresist 6 has been exceeded, the gold grows over the surface of the photoresist 6 as well. This growth continues until the thickness of the bump electrode 8 has reached a predetermined value. At the point at which the growth ends, part of the base surface of the bump electrode 8 has developed a stepped shape that rises over the photoresist 6.

The formation of the bump electrode 8 by an electroplating method is done by growing it uniformly over the under electrode layer 5. At the point at which the formation of the bump electrode 8 ends, therefore, the shape of the surface of the bump electrode 8 reflects the projections and depressions of the under electrode layer 5.

Figure 9:
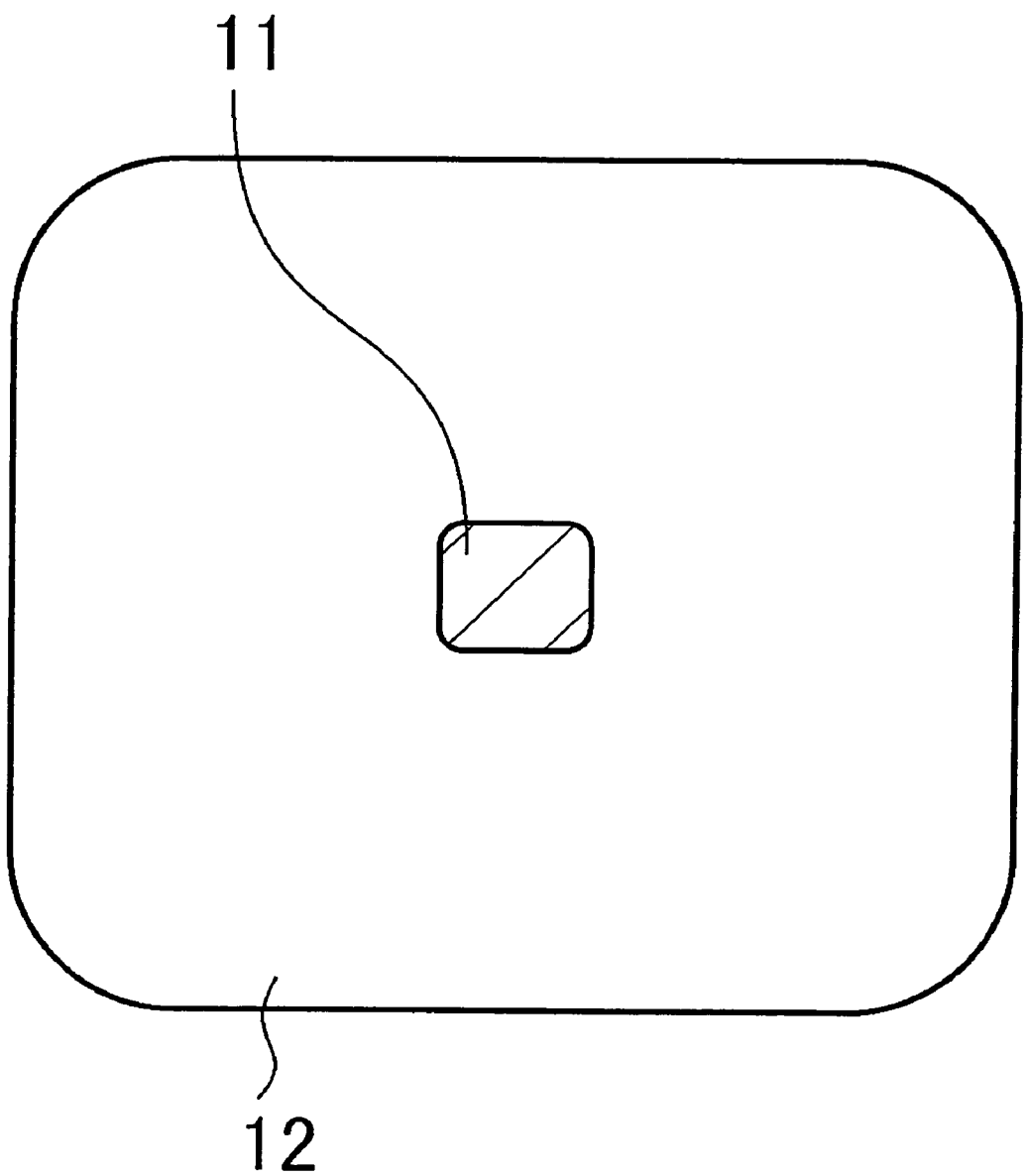
FIG. 9 is a schematic plan view of a projection and depression in the bump electrode surface in accordance with this embodiment.
Figure 11:
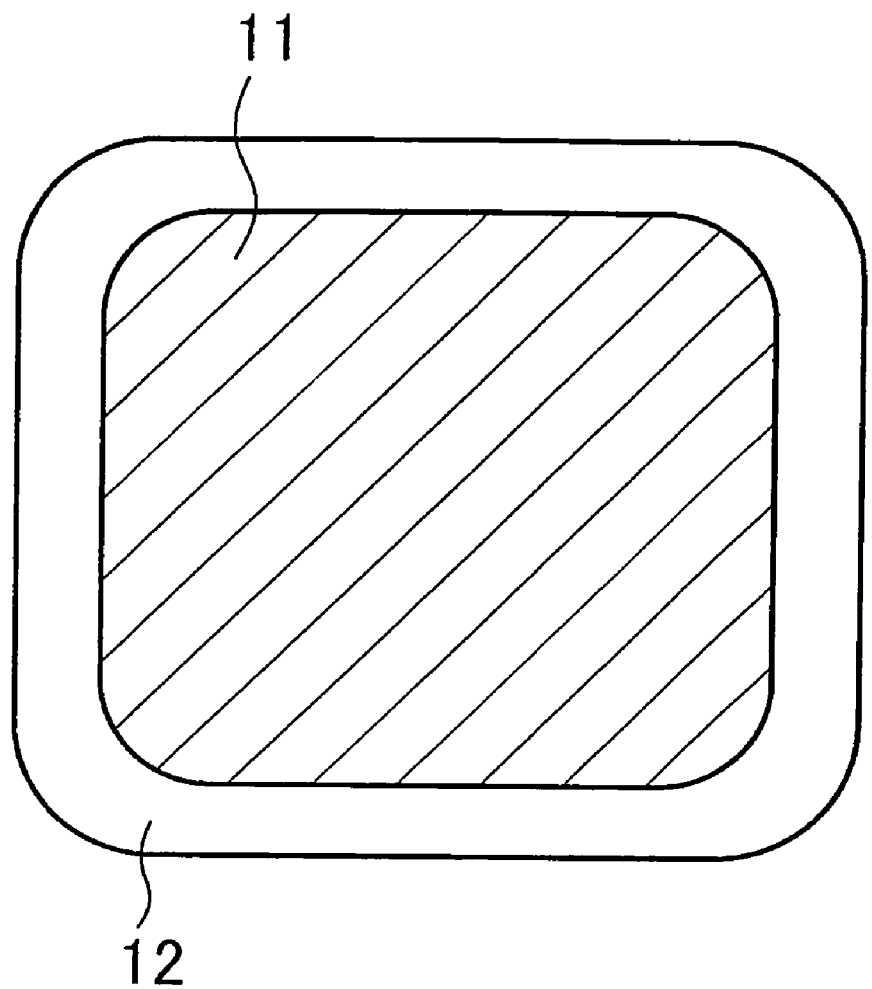
FIG. 11 is a schematic plan view of a projection and depression in the conventional bump electrode surface.
Figure 12:
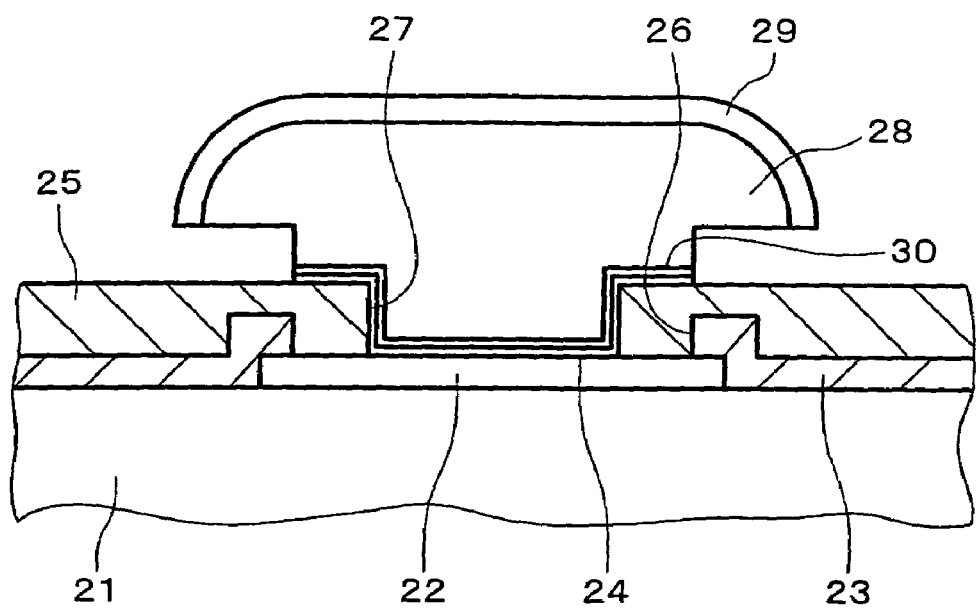
FIG. 12 is a schematic section through the structure of a conventional bump electrode.

Schematic plan views of the surface of the bump electrode 8 are shown in FIGS. 9 and 11. FIG. 9 shows the state of the surface of the bump electrode 8 in accordance with this embodiment. FIG. 11 shows the state of the surface of the bump electrode 8 in accordance with the conventional technique. In the conventional example shown in FIG. 11, a surface depression 11 of the bump electrode 8 has a surface area that extends widely from a central part to the peripheral portion thereof, and a surface protrusion 12 of the bump electrode 8 is limited to part of the peripheral portion thereof. With this embodiment, on the other hand, the surface depression 11 of the bump electrode 8 is limited to part of the center and the surface protrusion 12 of the bump electrode 8 has a broader surface area. This difference is created by the ratio between the surface area of the aperture of the hole 4 and the surface area of the bump electrode 8. In other words, the metal of the bump electrode 8 is grown by the electroplating method along the under electrode layer 5, so that the surface area of the aperture of the hole 4 grows into a state in which it is depressed further than the polyimide layer 3. As a result, projections and depressions remain in the surface of the bump electrode 8, without completely filling in the depression over the hole 4, even at the point at which the growth ends.

Figure 3B:
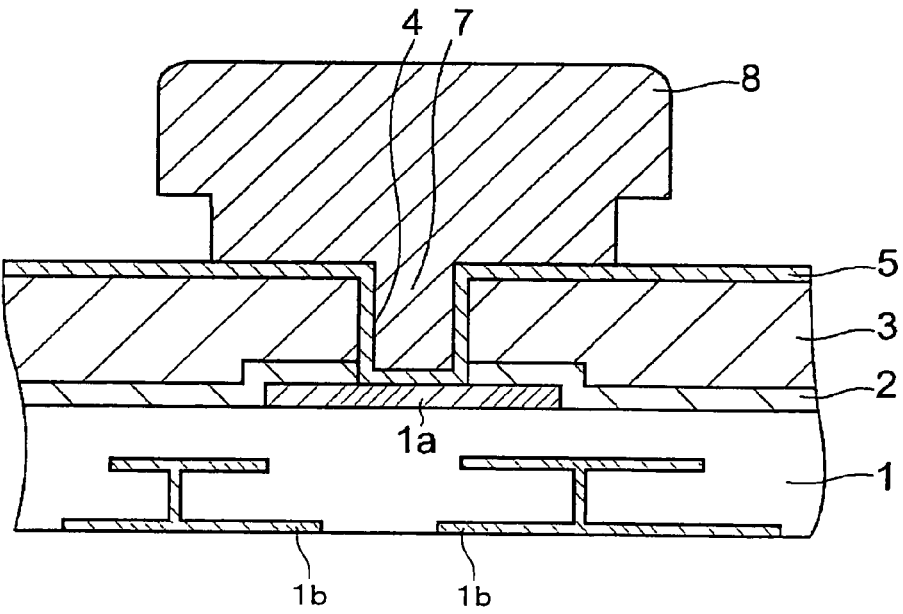

A sectional view illustrating a step of removing the photoresist 6 is shown in FIG. 3B. The removal of the photoresist 6 creates a step in the bump electrode 8 such that there is a difference in size between the dimensions of the region in which the bump electrode 8 is formed (and thus the diameter of the portion from which the photoresist 6 has been removed) and the dimensions of the bump electrode 8 that has been formed over the photoresist 6. The bump electrode 8 having such a shape is called a mushroom bump. In this mushroom bump, the portion that forms the umbrella thereof enables a cavity of exactly the thickness of the photoresist 6. If it is subjected to an impact during the bonding, such as by thermal pressure, the umbrella-shaped portion of the mushroom bump will sink by the height of that cavity, alleviating the pressure stresses. If the pressure stresses are alleviated, the pressure force applied during the bonding of the chip to another component such as the bonding substrate will be reduced, making it difficult for bonding defects to occur. It is therefore preferable to make the umbrella-shaped portion of the mushroom bump as small as possible. With this embodiment, tile predetermined dimensions can be controlled by adjusting the thickness of the photoresist 6 and the thickness of the bump electrode 8.

Figure 4:
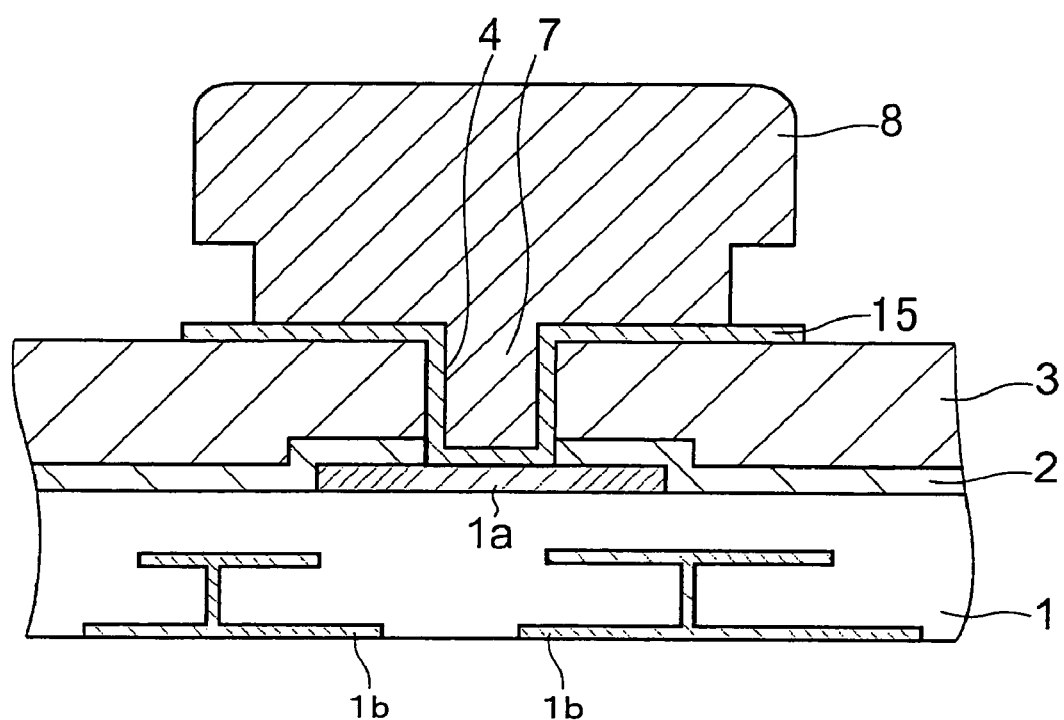
FIG. 4 is a schematic section illustrating a step in the manufacture of a semiconductor device in accordance with the first embodiment.

A sectional view illustrating a step of forming the under electrode 15 is shown in FIG. 4. The photoresist (not shown in the figure) is first formed over the entire surface of the semiconductor substrate 1 by a spin-coating method. It is then exposed and developed to form a photoresist pattern. A part of the under electrode layer is then removed by a wet etching method in accordance with the photoresist pattern to form the under electrode 15. The bump electrode 8 of this embodiment is completed by finally removing the photoresist. Note that another method such as dry etching could also be used instead of the wet etching method to remove a part of the under electrode layer. A wet etching method would be effective means for removing a difficult metal or alloy.

Figure 8:
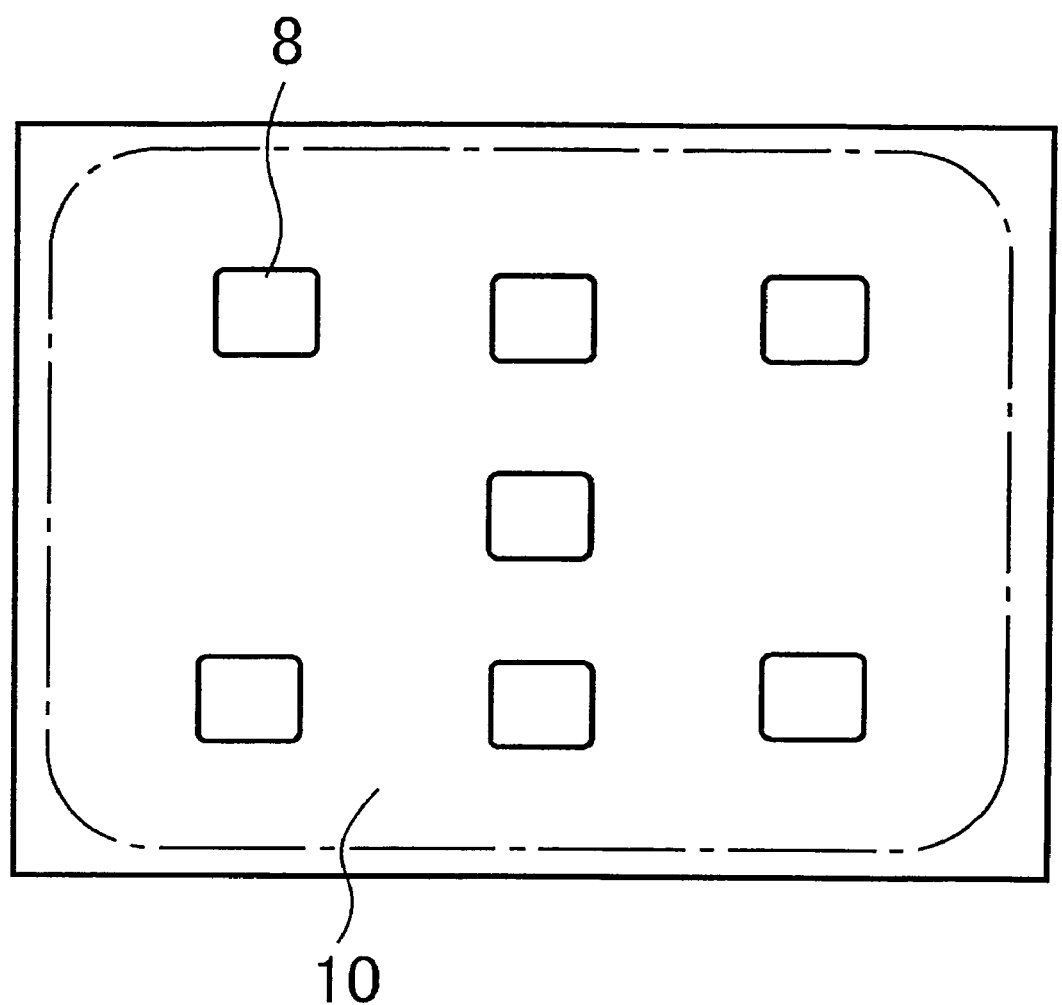
FIG. 8 is a schematic plan view of the disposition of bump electrodes formed on a semiconductor device in accordance with an embodiment of the present invention.
Figure 10:
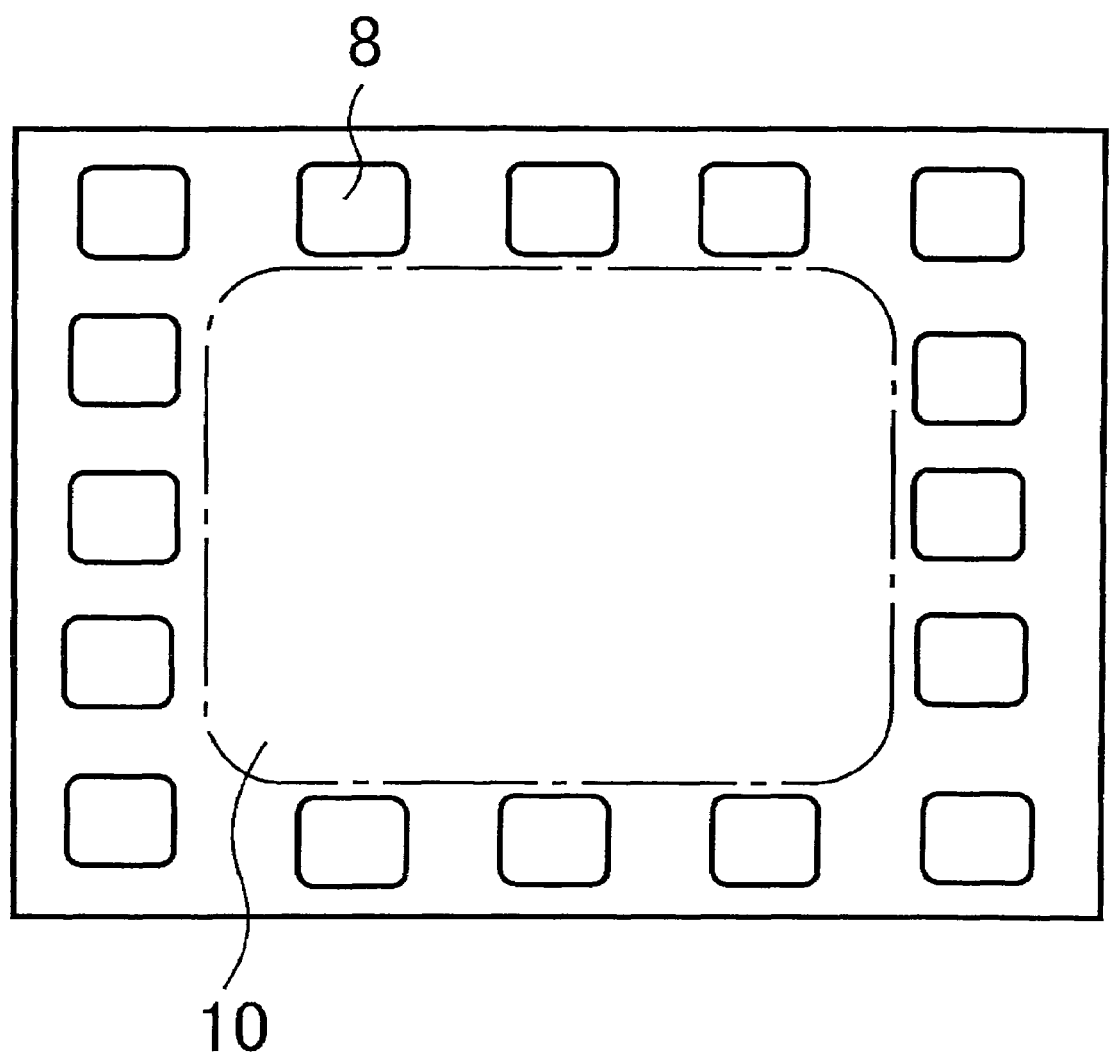
FIG. 10 is a schematic plan view of the disposition of bump electrodes formed on a conventional semiconductor device.

A plan view of the disposition of the bump electrodes 8 fabricated by this embodiment is shown in FIG. 8. With this embodiment, the bump electrodes 8 are formed over a semiconductor chip formation region 10. In the conventional example of FIG. 10, the bump electrodes 8 are formed only in a peripheral portion of the bump electrode 8, but with this embodiment they can also be formed on top of the semiconductor chip formation region 10 in addition to the peripheral portion of the chip.

In this case, the ratio of the thickness of the buffer layer (polyimide layer) 3 to the diameter of the hole 4 (the thickness of the polyimide layer 3 to the diameter of the hole 4; hereinafter called the "aspect ratio") is considered. The first case to consider is that in which the aspect ratio is small, in other words, the polyimide layer 3 is thin. In such a case, the polyimide layer 3 is unable to sufficiently fulfill the role of a buffer layer, and there is increased danger of damage to the semiconductor chips or the chip by impact due to thermal pressure during bonding. Another case to consider is that in which the internal surface area of the hole 4 is large. In such a case, since an increased proportion of the impacts due to thermal pressure during bonding are applied directly below the bump electrode 8 rather than the polyimide layer 3 in contact therewith, there is danger of damage to the semiconductor chips or the chip thereby. If the aspect ratio is large, on the other hand, there is a danger that it will become impossible to form the under electrode layer 5 by sputtering. In other words, it is increasingly likely that the material of the under electrode will not reach as far as the base surface and the inner surface of the hole 4. Another cause to consider for an increase in the aspect ratio is that the internal surface area of the hole 4 is too small. In such a case, the conductive layer 7 formed within the hole 4 could become embedded in the under electrode layer 5. Since the material of the under electrode layer 5 is generally not a flexible substance, not only is it highly likely that the conductive layer 7 itself will crack due to impacts caused by thermal pressure during bonding, but there is a danger that those impacts would not be mitigated and would damage the semiconductor chips. It is therefore preferable to set the range of the aspect ratio of the hole 4 to between 1 and 3, more preferably to between 1.5 and 3, and even more preferably to between 2 and 3.

The relationship between the surface area of the bump electrode 8 and the surface area of the base of the hole 4 will now be considered. If the ratio between the surface area of the bump electrode 8 and the surface area of the base of the hole 4 is small, it can be considered that the surface area of the contact between the lower part of the bump electrode 8 and the polyimide layer 3 is also small. In such a case, the polyimide layer 3 will not mitigate impacts due to thermal pressure during bonding sufficiently, the proportion of impact stresses imparted to directly below the bump electrode 8 will increase, and the danger of a crack of the semiconductor chips or the chip will strengthen. If the ratio between the surface area of the bump electrode 8 and the surface area of the base of the hole 4 is large, on the other hand, the stresses caused by impacts due to thermal pressure during bonding can easily concentrate in the bonding portion between the bump electrode 8 and the conductive layer 7. As a result, the possibility of wiring breakages between the bump electrode 8 and the conductive layer 7 will increase. The possibility of wiring breakages will increase even further if the conductive layer 7 has a narrow shape. It is therefore preferable to set the range of the ratio between the surface area of the bump electrode 8 and the surface area of the base of the hole 4 to between 5 and 100, more preferably to between 10 and 100, and even more preferably to between 15 and 100.

The effects of the first embodiment of the present invention are stated below.

(1) By increasing the surface area of each bump electrode 8 in contact with the under electrode 15 by the surface area of the base of the hole 4, the surface area of the contact between the lower surface of each bump electrode 8 and the polyimide layer 3 is increased, thus increasing the effect of mitigating the impact loads applied during bonding. It is therefore possible to prevent a crack of a semiconductor chip or the like, even if that semiconductor chip is formed directly under one of the bump electrodes 8.

(2) By increasing the surface area of each bump electrode 8 in contact with the under electrode 15 by the surface area of the base of the hole 4, the flatness of the surface of each bump electrode 8 is increased, as shown in FIG. 8. As a result, the surface area of bonding during the thermal pressure bonding is increased, increasing the bonding strength. In addition, the pressure of thermal pressure can be reduced, thus enabling a reduction in the impact imparted to the chip.

(3) If the aspect ratio of the hole 4 is greater than or equal to 1, in other words, if the thickness of the polyimide layer 3 is greater then the length of the base surface of the hole 4, the polyimide layer 3 can sufficiently mitigate the impact loads applied during bonding if the aspect ratio of the hole 4 is greater, the conductive layer 7 can be made relatively thinner. Since the conductive layer 7 is of gold in this embodiment, the expansion thereof can be increased by making the shape thinner. As a result, not only can it withstand impact stresses, it can also absorb other stresses.

(4) The placing of the conductive layer 7 in the center of each bump electrode 8 makes it possible to remove any uneven distribution of bonding load on each bump electrode 8 due to factors such as thermal pressure during bonding. The resistance with respect to bonding loading can therefore be increased, making it possible to perform stable bonding.

(5) The use of a photosensitive polyimide in the buffer layer 3 makes it possible to reduce the photolithography step in the process of forming the hole. The manufacturing costs can therefore be reduced.

(6) Since the conductive layer 7 and the bump electrodes 8 are formed continuously by an electroplating method, this has the advantage of reducing manufacturing costs.

(7) The use of gold in the bump electrodes 8 enables the bump electrodes 8 to absorb stresses during bonding. Since this is also a chemically stable substance, it has the advantage of providing superlative environment-proofing.

(8) Since each bump electrode 8 has a configuration that increases the effect of mitigating impact loading during bonding, each bump electrode 8 can be formed on the region in which semiconductor chips are formed. The result is a broadening of the degree of freedom of layout design, such as the disposition of the bump electrodes 8. Since the positions at which the bump electrodes 8 are formed can be freely chosen, the bump electrodes 8 can be formed on the active surface of the chip and thus the surface area of the chip can be reduced.

(9) By making it possible to form the bump electrodes 8 in the vicinity of semiconductor chips, the wiring connecting the bump electrodes 8 to the semiconductor chips can be shortened. The shortening of the wiring reduces delays in electrical transfer speed between the semiconductor chips and the bump electrodes 8, making it possible to achieve desired response characteristics.

Second Embodiment

The description now turns to a second embodiment of the present invention, with reference to FIGS. 5 and 6. This process is similar to that of the first embodiment, up until the step of forming the under electrode layer 5, shown in FIGS. 1A to 1D, 2A, and 2B.

Figure 5A:
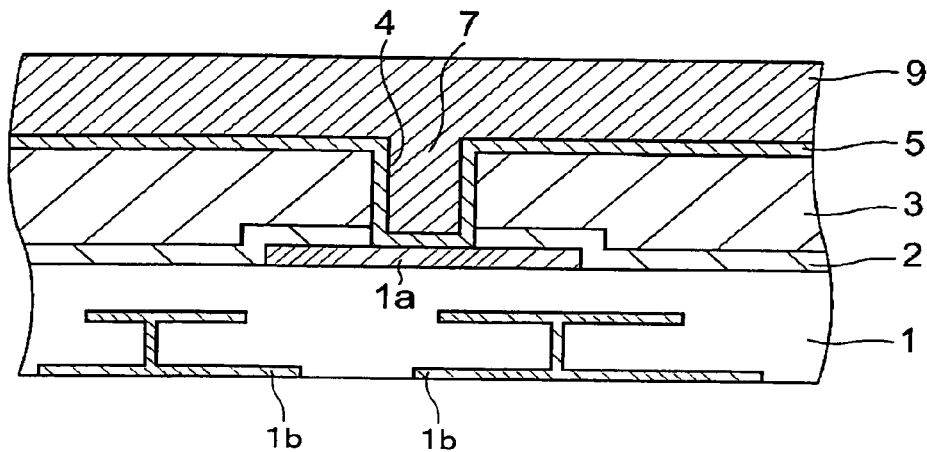
FIGS. 5A to 5C are schematic sections illustrating steps in the manufacture of a semiconductor device in accordance with a second embodiment of the present invention.

A sectional view illustrating a step of forming an electrically conductive resin layer is shown in FIG. 5A. Electrically conductive resin 9 is a resin such as an epoxy resin, silicone resin, phenol resin, or acrylic resin dissolved in an organic solvent to form a paste in which electrically conductive particles are dispersed within that organic solvent. The material of the electrically conductive particles can be any of various metal powders, such as gold, silver, copper, solder, or other metal depending on the application. A paste of the electrically conductive resin 9 is first formed over the entire surface of the semiconductor substrate 1 by a spin-coating method. During this time, the paste of the electrically conductive resin 9 is formed to fill the entire interior of the hole 4. The paste of the electrically conductive resin 9 is then hardened by thermal processing. The temperature of the thermal processing is from room temperature to approximately 200° C., under predetermined conditions. In this case, the electrically conductive resin 9 that fills the hole 4 functions as the conductive layer 7. A metal filler dispersed within an epoxy resin could also be used as the electrically conductive resin 9, by way of example. Note that the electrically conductive resin 9 could be formed by screen-printing or an inkjet method, instead of a spin-coating method.

Figure 5B:
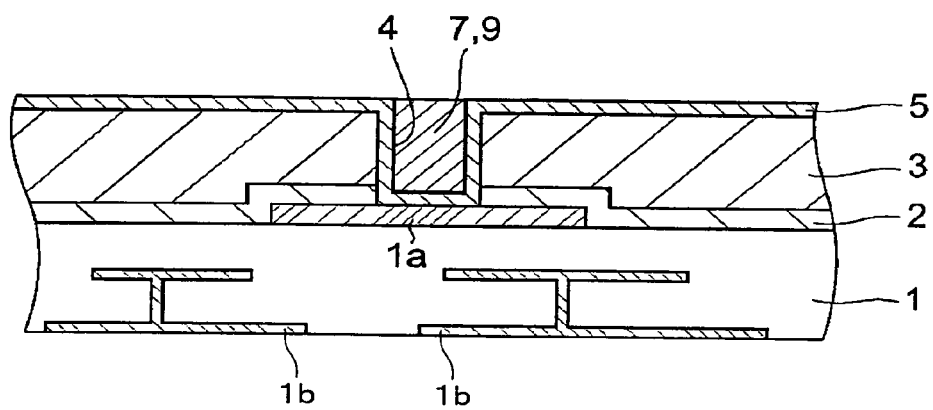

A sectional view illustrating a step of removing the electrically conductive resin is shown in FIG. 5B. The electrically conductive resin 9 is removed by a dry etching method, with the under electrode layer 5 acting as an etching stop layer. The surface of the under electrode layer 5 is then cleaned to cleanse it.

Figure 5C:
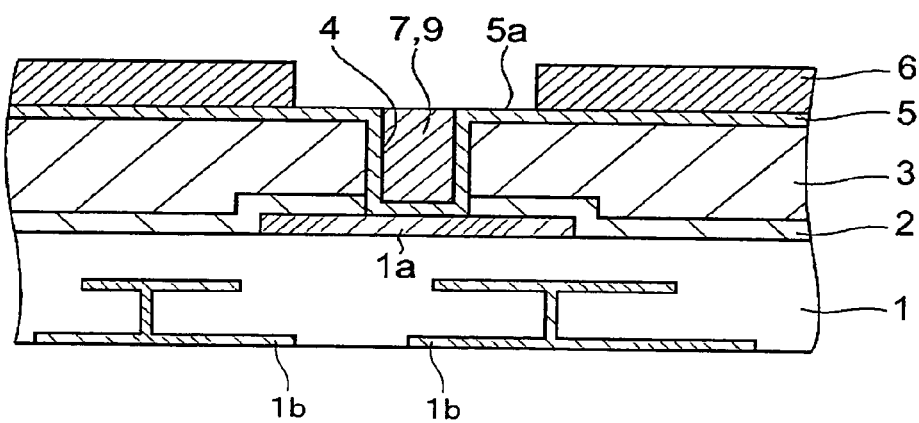

A sectional view illustrating a step of forming a photoresist layer for forming a region for the bump electrode 8 is shown in FIG. 5C. This step is similar to that of the first embodiment, shown in FIG. 2C. The photoresist 6 is first formed over the entire surface of the semiconductor substrate 1 by a spin-coating method. The photoresist 6 is then exposed and developed, to remove the photoresist 6 in a region including the hole 4. The portion from which the photoresist 6 has been removed becomes a bump electrode formation region 5a. The surface area for the region for forming the bump electrode 8 is approximately 1600 $\mu m^2$, including the surface area of the hole 4.

A sectional view illustrating a step of forming the bump electrode 8 is shown in FIG. 6A. This step is similar to that of the first embodiment, shown in FIG. 3A. This embodiment differs from the first embodiment in that the conductive layer 7 has already been formed embedded in the electrically conductive resin 9. In this embodiment, since a portion formed of gold by electroplating is substantially flat, the electrode surface after the formation of the bump electrode 8 has a higher degree of flatness than that of the first embodiment.

A sectional view illustrating a step of removing the photoresist is shown in FIG. 6B. This step is similar to that of the first embodiment, shown in FIG. 3B. In other words, a step is created in the shape of the bump electrode 8 by the removal of the photoresist 6, to form a mushroom shape.

A sectional view illustrating a step of forming the bump electrode 8 after removing a part of the under electrode layer is shown in FIG. 6C. This step similar to that of the first embodiment, shown in FIG. 4. The photoresist (not shown in the figure) is first formed over the entire surface of the semiconductor substrate 1 by a spin-coating method. It is then exposed and developed to form a photoresist pattern. A part of the under electrode layer is then removed by a wet etching method in accordance with the photoresist pattern to form an under electrode 15. The bump electrode 8 of this embodiment is completed by finally removing the photoresist. Note that another method such as dry etching could also be used instead of the wet etching method to remove part of the under electrode layer.

The effects of the second embodiment of the present invention are stated below.

(1) By forming the conductive layer 7 between the bump electrode 8 and the electrode 1a of the semiconductor substrate 1 of the electrically conductive resin 9 that is more flexible than the material of the bump electrode 8, impact loads applied during bonding can be mitigated by a synergistic effect between that flexible conductive layer and the polyimide layer 3 formed over the silicon nitride layer 2. It is therefore possible to prevent a crack of the semiconductor chips or the like, even if such a semiconductor chip is formed directly under the bump electrode 8.

(2) Before the bump electrode 8 is formed, the portion where the bump electrode 8 is to be formed by an electroplating method is flattened by embedding the electrically conductive resin 9 in the hole 4 and forming the conductive layer 7. This therefore increases the eventual flatness of the electrode surface of the bump electrode 8. As a result, the surface area of bonding during the thermal pressure bonding is increased, increasing the bonding strength. The pressure of thermal pressure can also be reduced, enabling a reduction in the impact imparted to the chip.

Modifications

The embodiments of the present invention are not limited to those described above, and thus the modifications described below can also be formed.

In the embodiments herein, Ti—W was used in the under electrode 15, but other alloys such as Ti—Pd—Au, Ti—Cu, or Cr—Cu could also be used therefor. Ti and Cr are materials that increase the adhesive strength with respect to the Al that is the material of the semiconductor electrode. Metals such as Pd, Pt, Cu, and W, on the other hand, are materials that increase the adhesive strength with respect to the material of the bump electrode. The material of the under electrode 15 also has the role of acting as a barrier metal in preventing brittle cracks due to alloying of the bump electrode material and the semiconductor electrode material.

A silicon nitride layer was used in the protective insulating layer of these embodiments, but any insulating film having silicon oxide, silicon oxide nitride, or moisture-proofing capabilities can be used therefor. If the buffer film also has moisture-proofing capabilities, it would be possible to omit the formation of the protective insulating film.

Gold was used in the bump electrode 8 of these embodiments, but a gold alloy such as Au—Sn could also be used therefor. In addition, copper, a copper alloy, silver or a silver alloy could be used therefor.

A photosensitive polyimide was used as the polyimide layer 3 in these embodiments, but an ordinary polyimide, a silicone resin, an epoxy resin, or a phenol resin could also be used therefor.

Figure 7A:
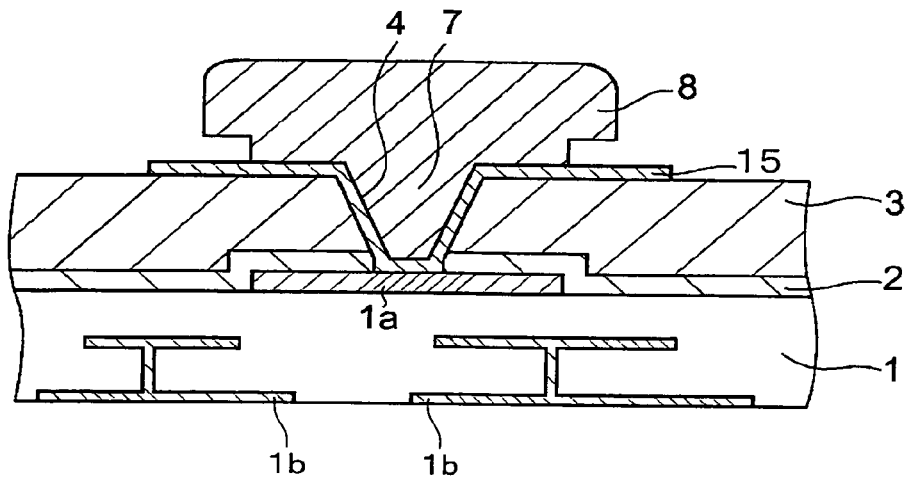
FIGS. 7A to 7C are schematic sections illustrating modifications of the semiconductor device in accordance with the present invention.

These embodiments could also be modified as described below. Modifications of the embodiments of the present invention as show in FIGS. 7A to 7C. FIG. 7A shows a semiconductor device in which the shape of the conductive layer 7 is tapered (trapezoidal). This tapering of the conductive layer 7 ensures that the "neck" portion at which the bump electrode 8 and the conductive layer 7 are in contact has acute angles. This reduces stress concentrations applied to the neck portion of the conductive layer 7 by thermal pressure during the bonding. This therefore makes it possible to reduce wiring breakage defects between the bump electrode 8 and the conductive layer 7.

Figure 7B:
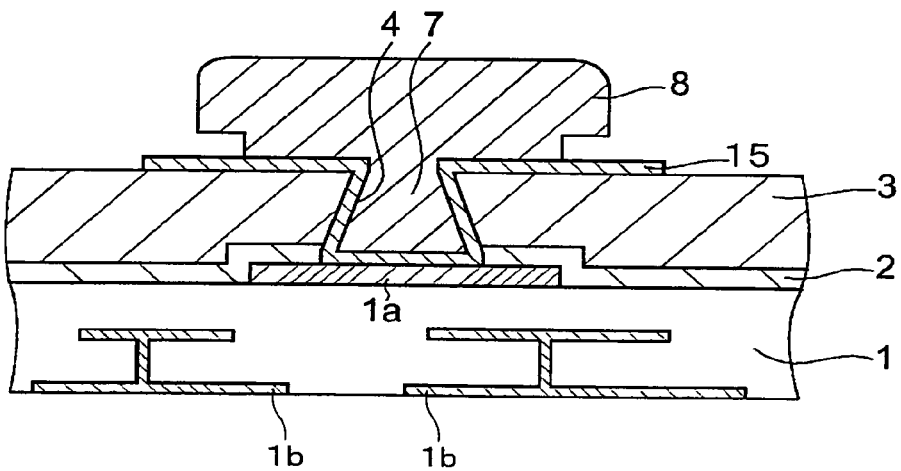

FIG. 7B shows a semiconductor device in which the shape of the conductive layer 7 in an inverted taper. This shaping of the conductive layer 7 into an inverted taper increases the surface area of the contact between the electrode 1*a* of the semiconductor substrate 1 and the under electrode 15 and with the conductive layer 7 through the under electrode 15. The sealing of the electrode 1*a* and the under electrode 15 is therefore increased, making it possible to prevent wiring breakage defects due to peeling of the electrode caused by impact during bonding. This improves the reliability of the bonding process.

Figure 7C:
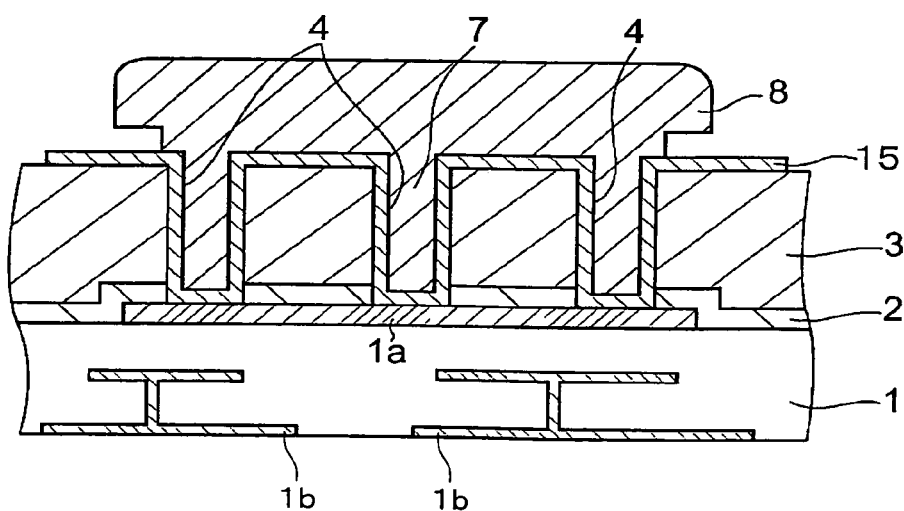

FIG. 7C shows a semiconductor device in which a plurality of the conductive layers 7 is formed for one bump electrode 8. The formation of a plurality of conductive layers 7 for one bump electrode 8 makes it possible to reduce wiring breakages between the bump electrode 8 and the conductive layers 7 due to the impact loads applied during bonding. In other words, even if there is one wiring breakage between the bump electrode 8 and one of the conductive layers 7, the bump electrode 8 can still function, provided there are no wiring breaks in the remaining conductive layers 7.

Note that technical concepts derived from the above embodiments are as described below.

(1) A semiconductor device comprises: a semiconductor substrate having an electrode; a protective insulating layer for protecting the electrode; a buffer layer formed over the protective insulating layer; a plurality of holes provided over the electrode in such a manner as to penetrate the protective insulating layer and the buffer layer; an under electrode formed over the surface of the buffer layer, the inner surface of the aperture portion, and the electrode surface; a plurality of conductive layers formed of an electrically conductive material embedded in the aperture portion; and a bump electrode formed over the under electrode and over the conductive layer; wherein the electrically conductive material is more flexible than the material of the bump electrode.

This configuration makes it possible to reduce wiring breakages between the bump electrode and the conductive layer due to the impact loads applied during bonding, by providing the conductive layer in a plurality of holes. In other words, the bump electrode can still function even if there is one wiring breakage between the bump electrode and one of the conductive layers, provided there are no wiring breaks in the remaining conductive layers. This therefore has the advantage of increasing bonding reliability.

(2) A semiconductor device comprises: a semiconductor substrate having an electrode; a protective insulating layer for protecting the electrode; a buffer layer formed over the protective insulating layer; a hole of a tapered shape provided over the electrode in such a manner as to penetrate the protective insulating layer and the buffer layer; an under electrode formed over the surface of the buffer layer, the inner surface of the aperture portion, and the electrode surface; a conductive layer of an electrically conductive material formed so as to be embedded in the aperture portion; and a bump electrode formed over the under electrode and over the conductive layer; wherein the electrically conductive material is more flexible than the material of the bump electrode.

Since this configuration inevitably tapers the conductive layer by tapering the shape of the hole, acute angles are formed at the neck portion at which the bump electrode and the conductive layer are in contact. This reduces stress concentrations applied to the neck portion by thermal pressure during the bonding. It therefore makes it possible to reduce wiring breakage defects between the bump electrode and the conductive layer.

(3) A semiconductor device comprises: a semiconductor substrate having an electrode; a protective insulating layer for protecting the electrode; a buffer layer formed over the protective insulating layer; a hole of an inverted tapered shape provided over the electrode in such a manner as to penetrate the protective insulating layer and the buffer layer; an under electrode formed over the surface of the buffer layer, the inner surface of the aperture portion, and the electrode surface; a conductive layer of an electrically conductive material formed so as to be embedded in the aperture portion; and a bump electrode formed over the under electrode and over the conductive layer; wherein the electrically conductive material is more flexible than the material of the bump electrode.

This configuration makes it possible to increase the contact surface area between the electrode of the semiconductor substrate and the under electrode and the conductive layer through the under electrode. The sealing of the semiconductor electrode and the under electrode is therefore increased, making it possible to prevent defects due to wiring breaks caused by electrode peeling by causes such as impact during bonding. This improves the reliability of the bonding process.

Although only some embodiments of the present invention have been described in detail above, those skilled in the art will readily appreciate that many modifications are possible in the embodiments without materially departing from the novel teachings and advantages of this invention. Accordingly, all such modifications are intended to be included within scope of this invention.

What is claimed is:

1. A semiconductor device comprising:
   a semiconductor substrate that has an electrode;
   a protective insulating layer that protects the electrode;
   a buffer layer that is formed over the protective insulating layer, the buffer layer having a first surface and a second surface, the first surface facing the protective insulating layer, the second surface being opposite to the first surface;

a hole that is provided over the electrode in such a manner as to penetrate the protective insulating layer and the buffer layer;

an under electrode that has a first portion and a second portion, the first portion being formed on the second surface of the buffer layer, the second portion being formed on the inner surface of the hole and the surface of the electrode, the first portion having a third surface facing the buffer layer and a fourth surface opposite to the third surface;

a conductive layer that is formed in the hole, the conductive layer being formed of an electrically conductive material, the conductive layer having a fifth surface facing the electrode and a sixth surface opposite to the fifth surface; and a bump electrode formed on the under electrode and on the conductive layer, wherein the conductive material is a material that is more flexible than a material of the bump electrode, wherein the sixth surface of the conductive layer and the fourth surface of the first portion of the under electrode are in the same plane.

2. The semiconductor device defined by claim 1, wherein the hole and the conductive layer are formed at substantially a center of the bump electrode.

3. The semiconductor device defined by claim 1, wherein the buffer layer is of a photosensitive polyimide.

4. The semiconductor device defined by claim 1, wherein the bump electrode is formed of gold or a gold alloy.

5. A semiconductor device comprising:

a semiconductor substrate that has an electrode;

an insulating layer that is formed on a surface of the semiconductor substrate on which the electrode is formed, the insulating layer having a first hole on the electrode;

a resin layer that is formed on the insulating layer, the resin layer having a second hole on the first hole, the resin layer having a first surface and a second surface, the first surface facing the insulating layer, the second surface being opposite to the first surface;

a first conductive layer that has a first portion and a second portion, the first portion being formed on the second surface of the resin layer, the second portion being formed on the inner surface of the first hole, the inner surface of the second hole and the surface of the electrode, the first portion having a third surface facing the resin layer and a fourth surface opposite to the third surface; and a second conductive layer that is formed in the first hole and in the second hole, the second conductive layer being formed of an electrically conductive material, the second conductive layer having a fifth surface facing the electrode and a sixth surface opposite to the fifth surface;

a bump electrode that is formed on the first conductive layer and on the second conductive layer, wherein the conductive material is a material that is more flexible than a material of the bump electrode, wherein the sixth surface of the second conductive layer and the fourth surface of the first portion of the first conductive layer are in the same plane.

* * * * *